(12) United States Patent
Lin

(10) Patent No.: US 6,466,472 B1
(45) Date of Patent: Oct. 15, 2002

(54) COMMON MODULE FOR DDR SDRAM AND SDRAM

(75) Inventor: Johnson Lin, Taipei (TW)

(73) Assignee: Giga-Byte Technology Co., Ltd., Taipei (TW)

( * ) Notice: Subject to any disclaimer, the term of this patent is extended or adjusted under 35 U.S.C. 154(b) by 0 days.

(21) Appl. No.: 09/833,657

(22) Filed: Apr. 13, 2001

(51) Int. Cl.$^7$ ................................................ G11C 5/06

(52) U.S. Cl. ........................ 365/63; 365/51; 361/728; 361/729

(58) Field of Search ........................ 365/52, 63, 149; 361/728, 729, 738

(56) References Cited

U.S. PATENT DOCUMENTS

| | | | | |
|---|---|---|---|---|
| 6,215,686 B1 | * | 4/2001 | Deneroff et al. | 361/728 |
| 6,347,367 B1 | * | 2/2002 | Dell et al. | 326/30 |
| 6,362,996 B2 | * | 3/2002 | Chang | 365/226 |
| 6,381,164 B1 | * | 4/2002 | Fan et al. | 361/769 |

* cited by examiner

Primary Examiner—Michael S. Lebentritt
Assistant Examiner—Van Thu Nguyen
(74) Attorney, Agent, or Firm—Birch, Stewart, Kolasch & Birch, LLP

(57) ABSTRACT

A common module for DDR SDRM and SDRAM on a motherboard, which computes and determines the resistance of the terminators on the motherboard so that the work current is controlled within the range allowed by an SDRAM controller, and can achieve the object of a DDR DRAM and SDRAM common layout without the need of an extra quick switch IC.

5 Claims, 2 Drawing Sheets

COMMON MODULE FOR DDR SDRAM AND SDRAM

BACKGROUND OF THE INVENTION

1. Field of Invention

The invention relates to a common module for DDR SDRAM and SDRAM. In particular, the invention achieves the object of a DDR SDRAM and SDRAM common layout without the need for an extra IC or increasing the cost.

2. Related Art

As the CPU (Central Processing Unit) is driven to high frequencies, the increases in the bus bandwidth and memory speed also become a key factor of the system efficiency. An analysis of the Rambus structure and the SDRAM-II, or DDR SDRAM (Double Data Rate Synchronous DRAM), indicates that both of them have the advantage of increasing data transmission rates.

On the other hand, since the DDR SDRAM structure is compatible with the current SDRAM structure, unlike Rambus which requires to redefine the socket standard, the application of the former is thus much easier than the later.

SDRAM (Synchronous DRAM) is a new model of the DRAM and has a much faster clock rate then conventional memory. Since it can be synchronous with the CPU bus and can simultaneously open two memory pages, the operation speed can reach 133 MHz.

The current Intel Pentium CPU series uses the 100 MHz and 133 MHz CPU buses, therefore the SDRAM can still support the system. However, future personal computers may use over 200 MHz buses, then the SDRAM will not be able to support the standard. Therefore, developing higher speed memory such as DDR SDRAM is more and more urgent.

Since the DDR SDRAM is able to support data transmissions according to the clock rates on both ends, the data transmission quantity of the memory chip is thus doubled. So it is also called the SDRAM II.

The state-of-art method for simultaneously supporting the DDR SDRAM and the SDRAM is to use a quick switch IC to control and switch the terminators to achieve the object of a DDR SDRAM and SDRAM common layout.

SUMMARY OF THE INVENTION

An object of the invention is to provide a common module for DDR SDRAM and SDRAM that achieves the goal of a DDR SDRAM and SDRAM common layout without the need of an extra quick switch IC.

After testing the disclosed common module, the terminators on a motherboard can be set to be between 220 Ω and 1250Ω. A preferred value is 330Ω. Within the preferred range, both the DDR SDRAM and the SDRAM can function normally and the work current falls within the range allowed by the SDRAM controller.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

In general, the termination voltage for the CMD (command) signals/ADD (address) signals, and DATA signals in DDR SDRAM is 1.25V. The termination voltage for the CMD (command) signals/ADD (address) signals, and DATA signals in SDRAM is 3.3V. However, the DDR SDRAM requires a terminator of 33 Ω while the SDRAM does not.

The terminator is a special resistor package or block that tells a computer where signal transmissions should end and ensures the stability of the whole circuit signal. The terminator functions like a filter, eliminating electric noises produced by many surrounding cables and equipment.

Therefore, the DDR SDRAM and the SDRAM need a common layout to share CMD signals/ADD signals and DATA signals. A proper terminator has to be chosen so that the DDR SDRAM and the SDRAM can function correctly under an invariant termination voltage.

Aside from utilizing the terminal function of the terminators, they are also used to detect DDR SDRAM devices. When a DDR SDRAM device is detected, it automatically switches the bus transmission mode into the DDR SDRAM mode. Of course, the whole bus will use the fast speed to transmit data. With the disclosed design, the SDRAM device can be connected to the same channel to achieve the goal of a common layout.

Figure 1:
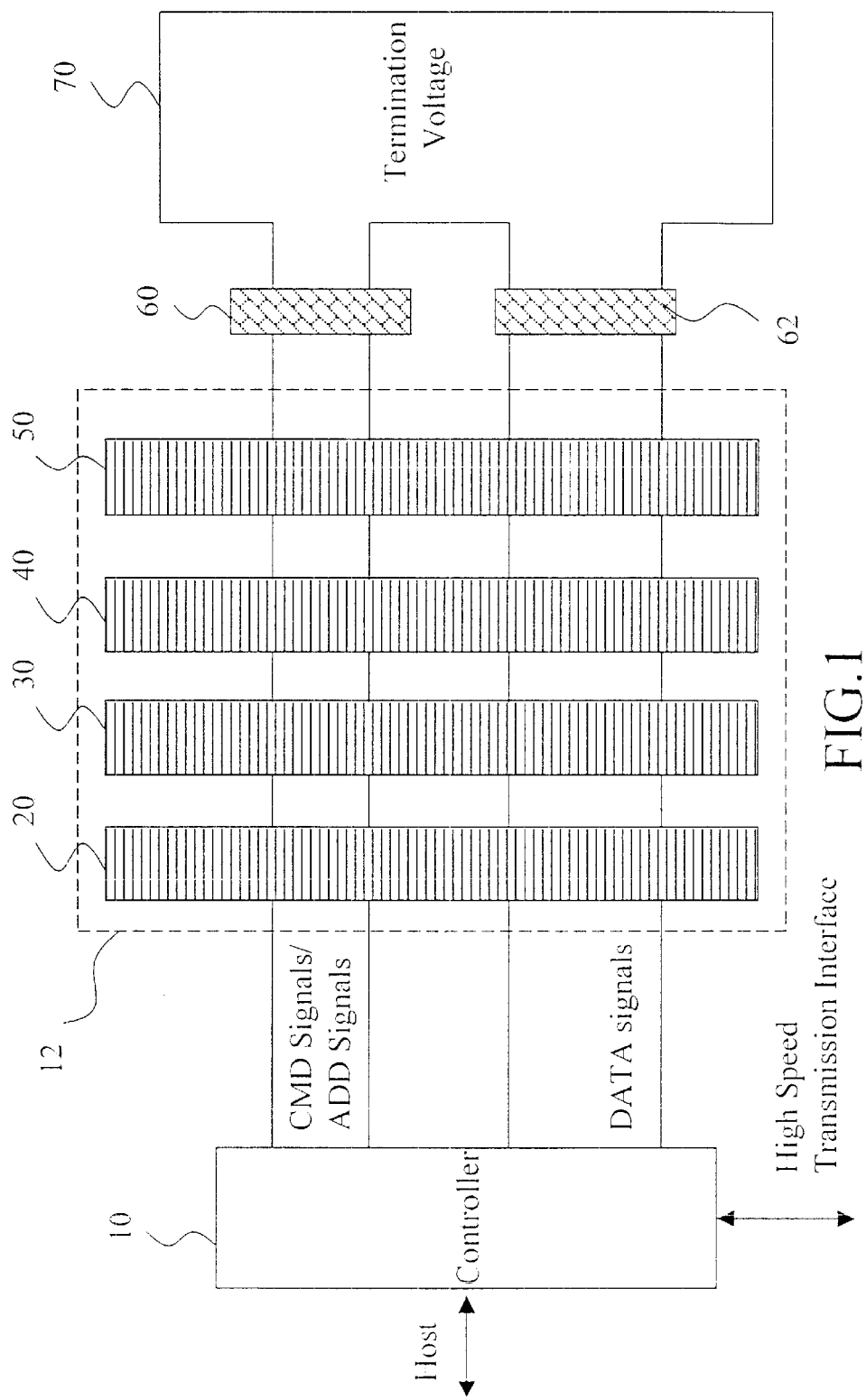
FIG. 1 shows a structure of the first embodiment common module for DDR SDRAM and SDRAM according to the invention.

As shown in FIG. 1, CMD signals/ADD signals and DATA signal are transmitted to a common module 12 through a controller 10. The common module 12 includes at least one DDR SDRAM DIMM (Dual In-line Memory Module) and at least one SDRAM DIMM.

In a first embodiment, the common module 12 a first DIMM 20, a second DIMM 30, a third DIMM 40. and a fourth DIMM 50 for the configuration of different numbers of DDR SDRAM and SDRAM devices. For example, two DDR SDRAM devices (first DDR SDRAM DIMM and second DDR SDRAM DIMM) go with two SDRAM devices (first SDRAM DIMM and second SDRAM DIMM); one DDR SDRAM (DDR SDRAM DIMM) goes with three SDRAM devices (first SDRAM DIMM, second SDRAM DIMM, and third SDRAM DIMM); or three DDR SDRAM devices (first DDR SDRAM DIMM, second DDR SDRAM DIMM, and third DDR SDRAM DIMM) go with one SDRAM device (SDRAM DIMM). Furthermore, through the design of the terminators 60, 62, the object of a common module can be obtained while keeping the termination voltage 70 invariant.

Figure 2:
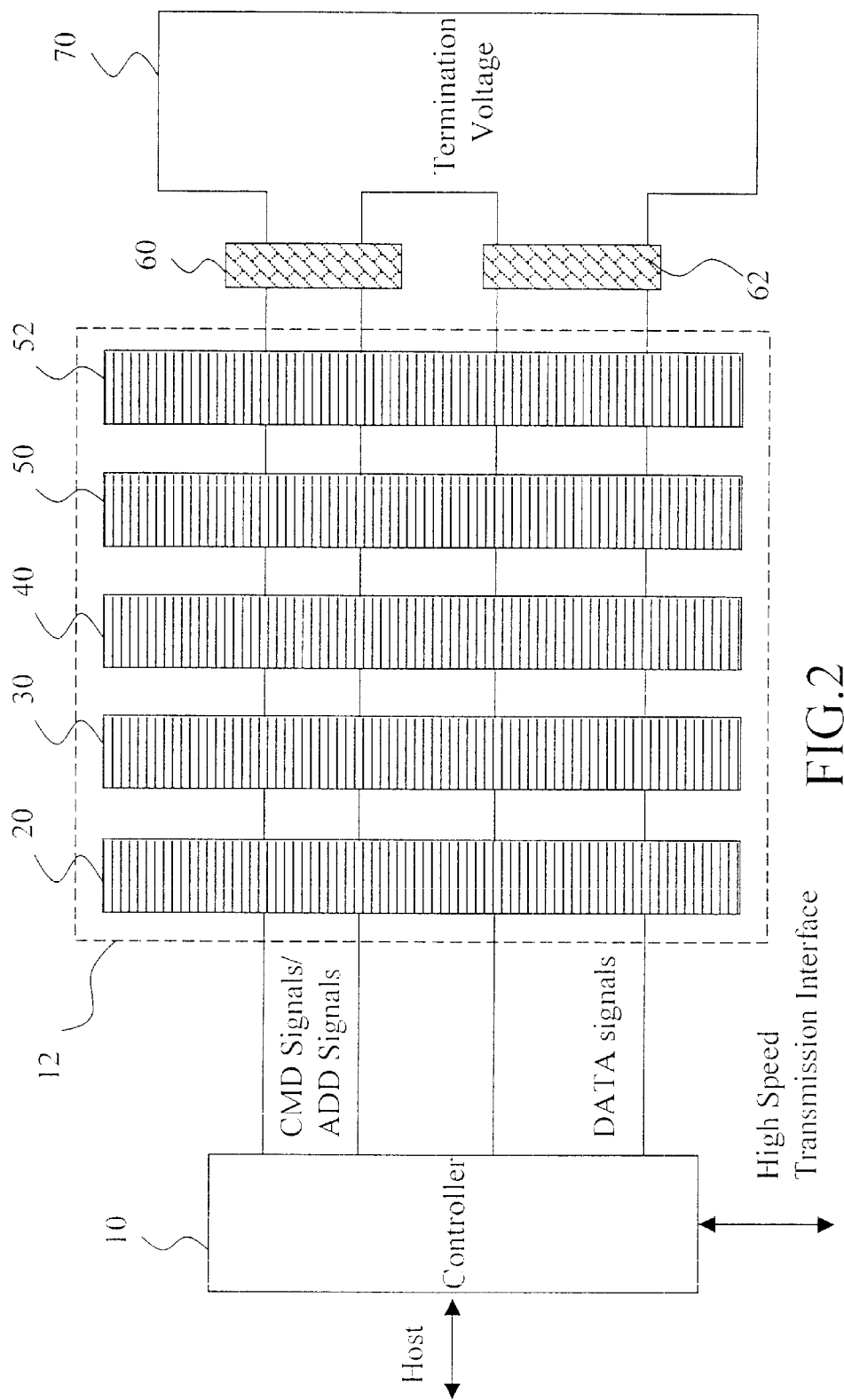
FIG. 2 shows a structure of the second embodiment common module for DDR SDRAM and SDRAM according to the invention.

With reference to FIG. 2, the common module 12 further contains a fifth DIMM 52 for a user to select different numbers of DDR SDRAM and SDRAM devices, as in the previous embodiment.

According to the results of computations and tests for the disclosed common module, the DDR SDRAM and the SDRAM can function normally when the terminator 60, 62 have resistance between 220 Ω and 1250 Ω. This takes into account the concern that the electric current for the SDRAM signal to be at HIGH and LOW has to fall in the allowed range set by an SDRAM controller.

The results for SDRAM CMD signals/ADD signals and DATA signals to be HIGH (IH) and to be LOW (IL) are listed as follows:

for terminators of 330 Ω:
  IH=(3.3−1.25)/0.33K=6.21 mA;
  IL=1.25/0.33K=3.79 mA;

for terminators of 220 Ω:
  IH=(3.3−1.25)/0.22K=9.31 mA;
  IL=1.25/0.22K=5.68 mA;
for terminators of 1250 Ω:
  IH=(3.3−1.25)/1.25K=1.64 mA;
  IL=1.25/1.25K=1 mA;

The DRAM has to be continuously refreshed in its potential difference. Otherwise, the potential difference may fall down to so low that it is insufficient to have enough energy representing in which state a memory unit is. According to the above calculation, IH and IL are both between 9.31 mA and 1 mA when varying the terminators 60, 62 from 220 Ω to 1250 Ω. This does not affect the signal transmission quality of the DDR SDRAM and the electric current falls within the allowed range enforced by the SDRAM controller. Thus, it is indeed a feasible common module.

Effects of the Invention

1. The invention provides users a cheaper motherboard memory environment with a greater compatibility. Users can select the best memory module according to their own needs, which is quite different from the conventional unique motherboard memory environments. The invention provides two memory modules for selection. For computer makers, the price is more flexible. For DIY users, it serves as a good tool to assemble a computer on one's own with an optimal performance/cost ratio.
2. The invention does not need to rely on any other IC. So it can achieve the DDR DRAM and SDRAM common layout without increasing the cost.
3. The invention reduces the design of quick switch IC, lowers the cost, provides more layout space for the motherboard, and decreases the electromagnetic interference caused by complicated circuits.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A common module for DDR SDRAM and SDRAM, which comprises:
   at least one DDR SDRAM DIMM;
   at least one SDRAM DIMM; and
   terminators coupling to the common module and outputting a termination voltage;
   wherein CMD signals/ADD signals and DATA signals are transmitted to the common module through a controller.
2. The common module of claim 1, wherein the termination voltage for the DDR SDRAM is 1.25V.
3. The common module of claim 1, wherein the termination voltage for the SDRAM is 3.3V.
4. The common module of claim 1, wherein the terminator is used to inform m a computer where signal transmissions should end and to ensure the stability of the whole circuit signals.
5. The common module of claim 1, wherein the resistance of the terminators is between 220 Ω and 1250 Ω.

* * * * *